(12) United States Patent
Guenther

(10) Patent No.: US 8,269,276 B2
(45) Date of Patent: Sep. 18, 2012

(54) METHOD FOR THE PRODUCTION OF MOS TRANSISTORS

(75) Inventor: Stefan Guenther, Dresden (DE)

(73) Assignee: STMicroelectronics NV, Amsterdam (NL)

( * ) Notice: Subject to any disclaimer, the term of this patent is extended or adjusted under 35 U.S.C. 154(b) by 0 days.

(21) Appl. No.: 12/748,865

(22) Filed: Mar. 29, 2010
(Under 37 CFR 1.47)

(65) Prior Publication Data
US 2010/0219477 A1 Sep. 2, 2010

Related U.S. Application Data

(60) Division of application No. 11/510,130, filed on Aug. 25, 2006, now Pat. No. 7,718,501, which is a continuation of application No. 11/329,399, filed on Jan. 10, 2006, now abandoned, which is a continuation of application No. 10/519,374, filed as application No. PCT/DE03/00836 on Mar. 14, 2003, now abandoned.

(30) Foreign Application Priority Data

Jun. 28, 2002 (DE) .................................. 102 29 265

(51) Int. Cl.
*H01L 29/788* (2006.01)
(52) U.S. Cl. ................................. 257/336; 257/E29.012
(58) Field of Classification Search .................. 257/336, 257/338, E29.012
See application file for complete search history.

(56) References Cited

U.S. PATENT DOCUMENTS

| | | | | |
|---|---|---|---|---|
| 5,416,036 A | * | 5/1995 | Hsue .............................. | 438/275 |
| 6,127,710 A | * | 10/2000 | Choi et al. ..................... | 257/410 |
| 6,187,620 B1 | | 2/2001 | Fulford, Jr. et al. | |
| 6,238,967 B1 | | 5/2001 | Shiho et al. | |
| 7,341,901 B2 | * | 3/2008 | Tran .............................. | 438/194 |

FOREIGN PATENT DOCUMENTS

EP 0 999 595 A2 5/2000

OTHER PUBLICATIONS

International Search Report from corresponding International Application No. PCT/DE2003/000835, filed Aug. 23, 2003. Onishi S. et al., *Formation of a Defect-Free Junction Layer by Controlling Defects Due to Asimplantation*, Proceedings of the Annual Reliability Physics Symposium, Las Vegas, Apr. 9-11, 1991, New York, IEEE, US, vol. Symp. 29, Apr. 9, 1991 pp. 255-259, XP010041344.

* cited by examiner

*Primary Examiner* — Quoc Hoang
(74) *Attorney, Agent, or Firm* — Wolf, Greenfield & Sacks, P.C.

(57) ABSTRACT

The invention relates to a method for the production of both MOS transistors with extremely low leakage currents at the pn junctions and logic/switching transistors, whose gates are laterally defined by spacers in a p-substrate or a p-well in an n-substrate. The aim of the invention is to provide a method for the production of MOS transistors with extremely low leakage currents that allows for parallel logic/switching transistors. This is achieved by initially carrying out an LDD ion implantation via the edges of the gates in order to form an LDD region and subsequently removing the spacers by means of an anisotropic etching step exhibiting high selectivity in relation to the gate and substrate materials, including the covering layers thereof, or by covering the MOS transistors with an extremely low leakage currents prior to isotropic spacer production such that the spacers are formed exclusively on the edges of the gates of the logic/switching transistors, while the MOS transistors with an extremely low leakage current always remain connected solely via the LDD region, and there is no high dose implantation in the S/D regions of these MOS transistors with extremely low leakage currents.

8 Claims, 4 Drawing Sheets

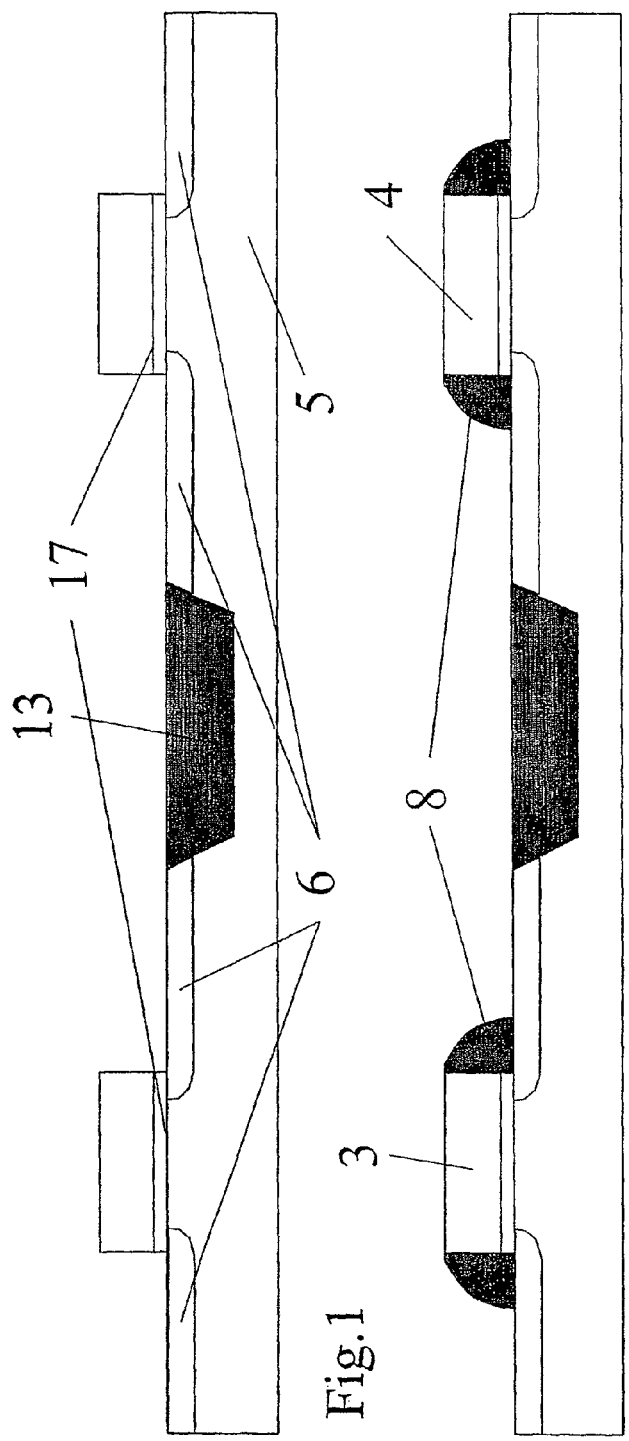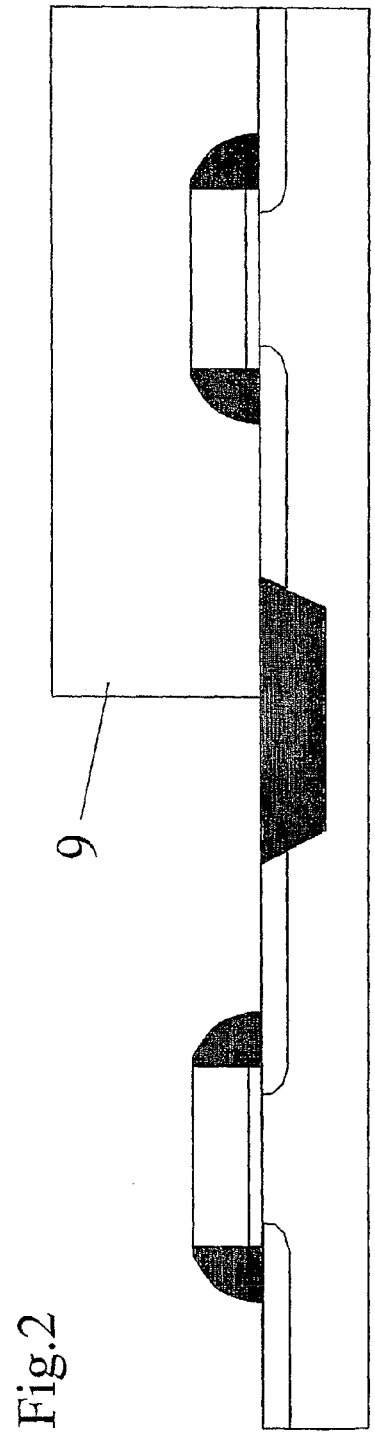

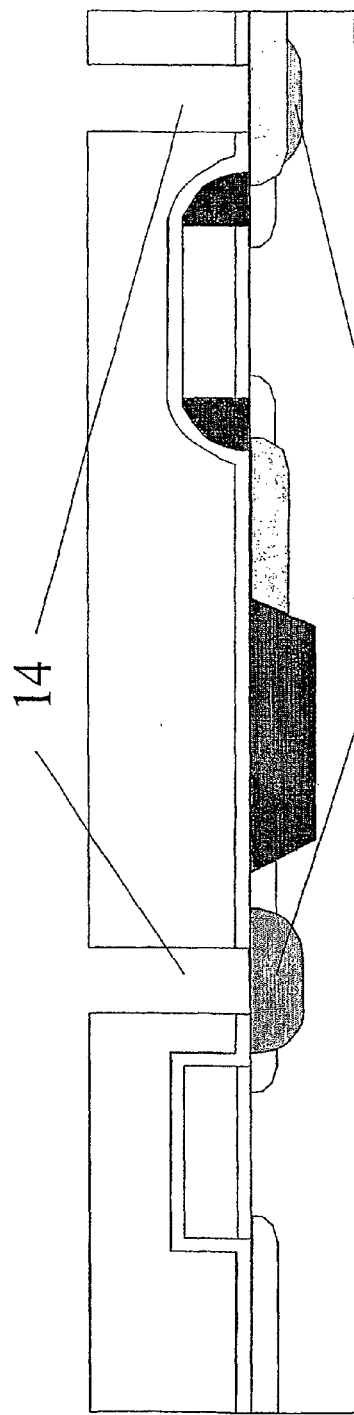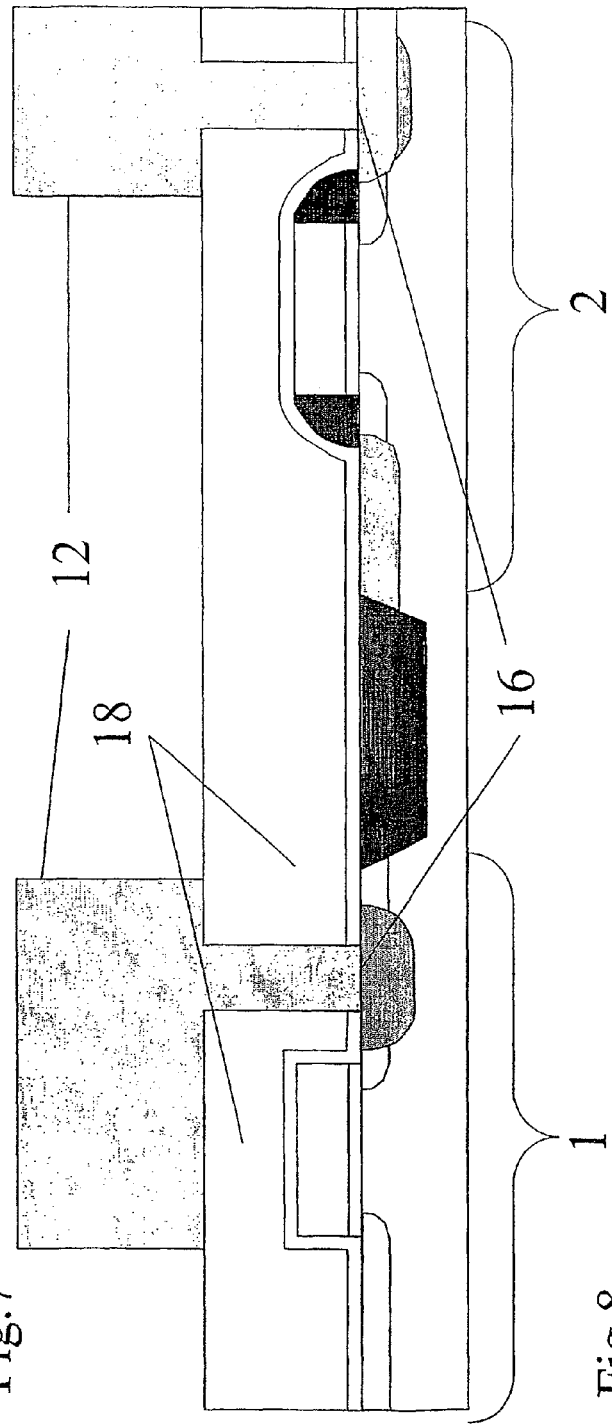

METHOD FOR THE PRODUCTION OF MOS TRANSISTORS

CROSS REFERENCE TO RELATED APPLICATIONS

This application is a divisional of U.S. application Ser. No. 11/510,130, filed Aug. 25, 2008, which is a continuation of U.S. application Ser. No. 11/329,399, filed Jan. 10, 2006 which is a continuation of U.S. application Ser. No. 10/519,374, filed Dec. 22, 2004, entitled METHOD FOR THE PRODUCTION OF MOS TRANSISTORS, which application claims the priority benefit of PCT patent application PCT/DE2003/000836, filed Mar. 14, 2003, which application claims the priority to German patent application Ser. No. 10/519,374, filed Jun. 28, 2002, which applications are hereby incorporated by reference to the maximum extent allowable by law.

BACKGROUND OF THE INVENTION

1. Field of the Invention

The invention relates to a method for the production of MOS transistors with extremely low leakage currents at the pn junctions, and also of logic/switching transistors, whose gates are laterally limited with spacers in a p-substrate or a p-well in an n-substrate.

2. Discussion of the Related Art

In standard DSM-MOS transistors (DSM: Deep Submicron Silicon Technology), the poly/silicide/salicide gates are provided with spacers to limit the leakage currents. In this manner, different materials are superimposed in the regions between the spacers. As a general rule, though, these materials are not exclusively silicon, polysilicon, silicon oxides and silicon nitrides. These materials naturally have different material properties, such as different coefficients of expansion. In connection with the deposition temperatures and the temperature loads that in particular the spacers experience during the overall production process, a mechanical stress arises at the spacer edges, among other places, finally resulting in increased leakage currents. These increased leakage currents are also initiated or increased via the implantation of high As doses (e.g., >E15/cm$^2$).

Furthermore, lattice defects cannot be completely annealed out because of the limited thermal budget of the production process, so that leakage currents can likewise be generated. The pn leakage currents are entirely acceptable for digital CMOS applications, but not for analog dynamic memories (e.g., image sensors). These leakage currents would substantially degrade the image information in the image sensors.

One known way to reduce these leakage currents is to perform an additional deep p diffusion, while retaining the spacers and the high-dose As implantation. This does not eliminate the causes of the leakage current, but reduces the effects of the leakage current. The defects are now within n regions, where most of them are inactive. However, a statistical number of these defects "grows" out of the additional p diffusion regions, and is hence active again. It is hardly possible to prevent that, so that significant and difficult to quantify yield risks remain and arise.

However, since diffusion is not just vertical, but also lateral, this leads to greater channel length, lower packing densities, increased parasitic elements (e.g., capacitances, propagation times), lower performance and, finally, higher costs.

SUMMARY OF THE INVENTION

Therefore, an object of the invention is to provide a method for producing MOS transistors exhibiting extremely low leakage currents that allows parallel n-channel switching transistors.

This object and others are achieved in a method by first performing an LDD ion implantation over the gate edges to form an LDD region, and then producing the spacers at all the gate edges or, in a different embodiment, only selectively at the n-channel switching transistors, wherein, in the former case, the spacers are removed in a masked anisotropic etching step comprising a high selectivity with respect to the gate and substrate materials, including their covering layers, the n-channel transistors with extremely low leakage currents are connected exclusively via LDD regions, the matching pn regions are not provided with a high-dose implantation (As), and are covered with an oxide layer.

Preferably, LDD ion implantation is used to implant phosphorus or boron/arsenic in a dual implantation.

Another embodiment of the invention provides that the n-channel switching transistors are free of photoresist before the etching step. As a result, the spacers are formed only for them, and can be used for a high-dose S/D implantation at a later point in the process.

After the etching step, the surface of the entire transistor structure is covered with a thermal oxide layer or a CVD layer to assure adequate protection of the transistor structure in the subsequent production steps.

This layer can be used to perform conventional S/D implantations for the switching transistors.

The S/D regions (source/drain regions) of the n-channel transistors with extremely low leakage currents are contacted via the opening of the insulation layer gate/metal-I contact, followed by metal deposition and structuring. Contact implantation can take place before or after contact opening to improve contacting.

In particular, some special advantages of the invention are that the interfering pn leakage currents are eliminated by simple means, thereby providing a reliable solution to the problem underlying the invention in terms of process stability, reproducibility and yield.

In addition, packing density is increased, parasitic effects are reduced, performance is improved, and further scaling capability is enhanced, thereby reducing costs.

BRIEF DESCRIPTION OF THE DRAWINGS

The invention will be explained in more detail below based on an exemplary embodiment. The accompanying figures in the drawing show:

FIG. 1: shows n-channel transistors 1, 2 with a typical CMOS structure after LDD implantation, with phosphorus implanted into the p-substrate base material 5, or even boron/arsenic in a dual implantation via the edges of gates 3, 4, thereby forming LDD regions 6. A p-well 19 in an n-substrate 20, as shown in FIG. 1A, can be used as possible base material 5;

FIG. 2: a schematic representation of n-channel transistors having a typical CMOS structure after LDD implantation and spacer production at all gate edges;

FIG. 3: a "conventional" n-channel transistor (n-channel switching transistor) covered with a photoresist layer;

FIG. 7: the structure corresponding to FIG. 5 with an oxide gate/metal insulation, contacts and contact window implantation; and FIG. 8: the structure corresponding to FIG. 7 with metallic coating.

DETAILED DESCRIPTION

Figure 1A:
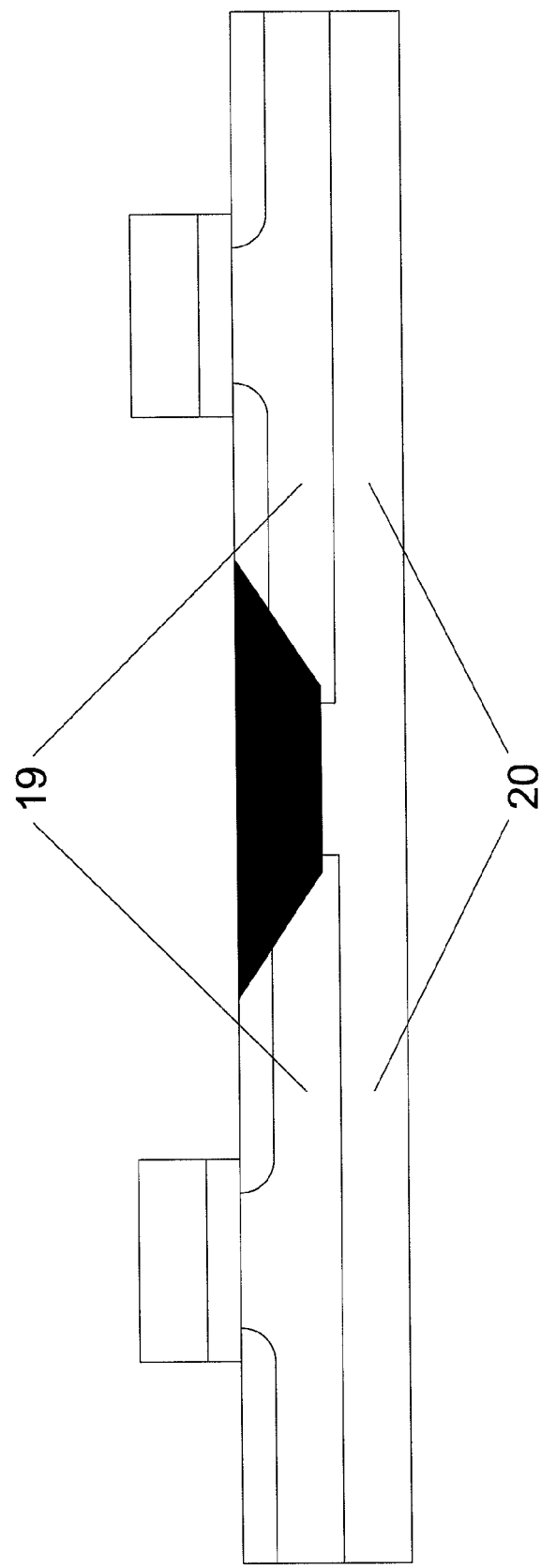
FIG. 1A: a schematic representation of n-channel transistors with a p-well in an n-substrate.

FIG. 1 shows n-channel transistors 1, 2 with a typical CMOS structure after LDD implantation, with phosphorus implanted into the base material 5, or even boron/arsenic in a dual implantation via the edges of gates 3, 4, thereby forming LDD regions 6. Both a p-substrate or a p-well in an n-substrate are possible as the base material 5.

FIG. 2 shows the structure after spacer production at the gates 3, 4.

It often makes sense to use "normal" n-channel transistors 2 in addition to the n-channel transistors 1 with an extremely low pn leakage current, e.g., for normal digital/switching functions.

For this reason, the region accommodating the n-channel switching transistors is covered with an initial photoresist 9 or another suitable etch-resistant layer, for example (FIG. 3).

Figure 4:
FIG. 4: the structure corresponding to FIG. 2 after the anisotropic etching of the spacer.

An anisotropic etching step subsequently takes place with a high selectivity relative to the gate and substrate materials, including their covering layers, to remove the spacers 8 in the desired regions (FIG. 4) requiring the lowest pn leakage currents. Instead of later removing the spacers 8, the production of spacers 8 can also be selectively omitted in preceding production steps on the n-channel transistors 1, which are to have a low leakage current.

Figure 5:
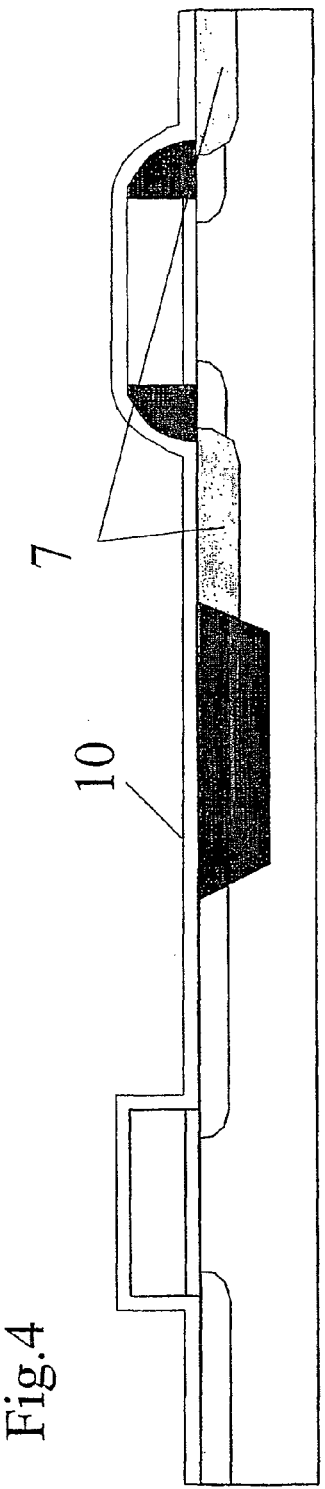
FIG. 5: the structure corresponding to FIG. 4 with a CVD covering.

A subsequent covering 10 with a CVD layer is shown in FIG. 5.

Figure 6:
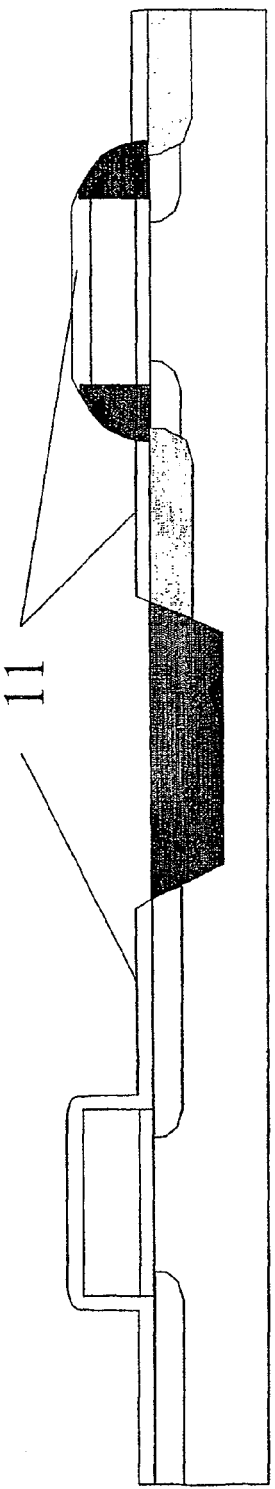
FIG. 6: the structure corresponding to FIG. 4 with an oxide covering.

FIG. 6 shows another variant, where a covering 11 was accomplished with a thermal oxide.

FIG. 7 shows the structure after S/D implantation 7, oxide isolation 18, contact opening 16 and contact window implantation 15.

FIG. 8 represents the structure after the first metal structuring and contacting. The method according to the invention can be summarized as follows:

The connection of the MOS transistor with extremely low leakage current is accomplished solely through LDD regions 6 within the active regions.

A selective removal/non-production of the spacer 8 takes place at the gate edges of the MOS transistors with extremely low leakage current.

No high-dose As implantation takes place at or in the vicinity of the gate edges and in the pn regions of the MOS transistors with an extremely low leakage current.

N-channel switching transistors are produced in parallel.

The transistor structures are covered with an oxide layer 11 before subsequent implantations or depositions, or there is a (moist) thermal oxidation of the surface of the transistor structures.

REFERENCE LIST 1 n-channel transistor with extremely low leakage current
2 "Normal" n-channel transistor/n-channel switching transistor
3 Gate of n-channel transistor with extremely low leakage current
4 Gate of "normal" n-channel transistor/n-channel switching transistor
5 Base material/p-substrate
6 LDD region
7 n+ S/D region of "normal" n-channel transistor/n-channel switching transistor
8 Spacer
9 Photoresist 1/first photoresist
10 CVD layer
11 Oxide layer
12 Metal conductor path
13 Field oxide
14 Contact window
15 Contact window implantation
16 Contact
17 Gate oxide
18 Oxide insulation gate/metal 1
19 P-well
20 n-substrate

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. An apparatus, comprising:
a first MOS transistor having a first gate, first spacers disposed on lateral edges of the first gate, and first S/D regions with a high-dose implantation; and
a second MOS transistor having second S/D regions without high-dose implantation and including only LDD regions and a second gate without any spacers disposed on lateral edges of the second gate.

2. The apparatus of claim 1, further comprising:
a first CVD layer and a first oxide insulation layer formed on a first surface of the first MOS transistor.

3. The apparatus of claim 2, further comprising:
a second CVD layer and a second oxide insulation layer formed on a second surface of the second MOS transistor.

4. The apparatus of claim 1, wherein the second MOS transistor is connected exclusively via an LDD region.

5. The apparatus of claim 1, further comprising:
a photoresist layer formed on the first MOS transistor and/or the second MOS transistor.

6. The apparatus of claim 5, wherein the photoresist layer is formed only on the first MOS transistor and not the second MOS transistor.

7. The apparatus of claim 1, further comprising:
a contact window and a contact opening implanted in the first MOS transistor and/or the second MOS transistor.

8. The apparatus of claim 7, further comprising:
a conducting path deposited in the contact opening of the first MOS transistor and/or the second MOS transistor.

* * * * *